United States Patent [19]

Barton

[11] 4,090,936

[45] May 23, 1978

[54] PHOTOHARDENABLE COMPOSITIONS

[75] Inventor: Robert W. Barton, Cottage Grove, Minn.

[73] Assignee: Minnesota Mining and Manufacturing Company, Saint Paul, Minn.

[21] Appl. No.: 736,540

[22] Filed: Oct. 28, 1976

[51] Int. Cl.$^2$ .............................. C08F 2/50; C08F 4/00
[52] U.S. Cl. ................................ 204/159.18; 96/35.1; 96/36; 96/115 P
[58] Field of Search ...................... 204/159.18, 159.24; 96/115 P, 115 R, 35.1

[56] References Cited

U.S. PATENT DOCUMENTS

| | | | |
|---|---|---|---|
| 3,711,391 | 1/1973 | Feinberg | 204/159.24 X |
| 3,729,313 | 4/1973 | Smith | 96/115 P X |
| 3,741,769 | 6/1973 | Smith | 96/35.1 |
| 3,759,989 | 9/1973 | Jezic | 260/539 A |
| 3,817,845 | 6/1974 | Feinberg | 204/159.24 X |
| 3,904,499 | 9/1975 | Morgan | 204/159.18 |
| 3,988,152 | 10/1976 | Roteman | 96/35.1 |
| 3,989,610 | 11/1976 | Tsukada et al. | 96/115 R X |

FOREIGN PATENT DOCUMENTS

| | | |
|---|---|---|
| 828,668 | 3/1975 | Belgium. |
| 828,669 | 3/1975 | Belgium. |
| 828,670 | 3/1975 | Belgium. |
| 828,841 | 3/1975 | Belgium. |

*Primary Examiner*—Walter C. Danison
*Attorney, Agent, or Firm*—C. Alexander; D. M. Sell; D. P. Edmundson

[57] ABSTRACT

Photohardenable, liquid compositions are described which are particularly useful as plating and etching resists.

9 Claims, No Drawings

PHOTOHARDENABLE COMPOSITIONS

BACKGROUND OF THE INVENTION

1. Field of the Invention

This invention relates to photohardenable compositions. More particularly, this invention relates to compositions which comprise an organic material having epoxide functionality and another organic material, compatible with the first organic material, which has a glass transition temperature in the range of −20° C. to 105° C. The compositions further contain an aromatic complex salt as photoinitiator and can be hardened by exposure to actinic radiation or electron beam irradiation.

2. Description of the Prior Art

Various types of plating and etching resists have been known and used for many years for various applications (e.g. in the making of printed circuitry, printing plates, etc.). Some types of resists are solvent-based and are hardened or solidified after being coated in the desired pattern by driving off the solvent (e.g. with heat). Some other types of resist are light sensitive and are hardened or solidifed by exposure to light after coating, whereupon the resist crosslinks or polymerizes to an insoluble state which is not easily removeable with conventional solvents.

In many applications it is extremely desirable (and in some cases it is necessary) to be able to rapidly and efficiently remove the resist pattern from a substrate with conventional solvent after the required etching or plating of the substrate has been completed. Although conventional solvent-based resists provide patterns which can later be removed with solvent after the desired plating or etching has been completed, such resists are undesirable by reason of the fact that in the initial formation of the resist pattern solvent must be removed. The pollution problems attendant with such procedure (i.e. removal of solvent), and the time required to obtain a hardened pattern, are inherent limitations associated with the use of such solvent-based resists.

THE PRESENT INVENTION

The present invention provides novel photohardenable, liquid compositions comprising (a) organic material having average epoxide functionality of about 1 to 3.1, (b) an organic polymer, compatible with the organic material, which has a glass transition temperature in the range of about −20° C. to 105° C., the organic polymer being selected from (i) polymers derived from at least one acrylate or methacrylate monomer, (ii) copolymers of styrene and allyl alcohol; and (iii) polyvinylbutyral polymers; and (c) an aromatic complex salt photoinitiator. Optionally, the compositions may contain a sensitizer for the photoinitiator. In one aspect of the invention the organic polymer has pendent hydroxyl groups.

The compositions are particularly useful as photoresists in, for example, the making of printed circuitry and may be readily photohardened by exposure to light or by exposure to electron beam irradiation. After the required etching or plating of the substrate has been completed, the resist pattern may be easily removed with solvent (e.g. methylene chloride).

The photohardenable compositions of the invention overcome the disadvantages of previously known compositions. For example, the compositions of the invention are one-part, stable compositions having excellent shelf life, and are photohardenable to tack-free state even at room temperature or below. The hardened matarial has good adhesion to metal and other surfaces and good resistance to etching and plating chemicals. Furthermore, the solvent-less, liquid compositions of the invention are 100% solids and accordingly obviate the problems and disadvantages associated with the use of solvent-based compositions, and energy-consumption and pollution are minimized. Because the compositions of the invention are liquids (having a viscosity in the range of about 5000 to 200,000 cps.) they can be easily silk-screened onto the desired substrate.

DETAILED DESCRIPTION OF THE INVENTION

Epoxy-containing materials useful in the compositions of the invention are any organic compounds having an oxirane ring (i.e.

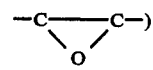

polymerizable by ring opening. Such materials, broadly called epoxides, include monomeric epoxy compounds and epoxides of the polymeric type and can be aliphatic, cycloaliphatic, aromatic or heterocyclic.

The materials which are useful in this invention generally have, on the average, from 1 to about 1.3 polymerizable epoxy groups per molecule. The polymeric epoxides include linear polymers having terminal epoxy groups (e.g. a diglycidyl ether of a polyoxyalkylene glycol), polymers having skeletal oxirane units (e.g. polybutadiene polyepoxide), and polymers having pendent epoxy groups (e.g. a glycidyl methacrylate polymer or copolymer). The epoxides may be pure compounds but are generally mixtures containing one, two, or more epoxy groups per molecule. Thus, the epoxides used may be mixtures of various types of materials, so long as the "average" epoxide functionality of the mixture is in the range of about 1 to 1.3. The "average" number of epoxy groups per molecule is determined by dividing the total number of epoxy groups in the epoxy-containing material by the total number of epoxy molecules present.

It has been found that the average functionality of the epoxide in the composition must be in the range of about 1 to 1.3 in order to obtain the proper amount of hardening of the composition upon light exposure (to obtain an effective resist pattern) while still permitting efficient solvent removal of the resist pattern at the desired time (i.e. after completion of the etching and plating steps).

These useful epoxy-containing materials may vary from low molecular weight monomeric materials to high molecular weight polymers and may vary greatly in the nature of their backbone and substituent groups. For example, the backbone may be of any type and substituent groups thereon can be any group free of an active hydrogen atom which is reactive with an oxirane ring at room temperature. Illustrative of permissible substituent groups include halogens, ester groups, ethers, sulfonate groups, siloxane groups, nitro groups, phosphate groups, etc. The molecular weight of the epoxy-containing materials may vary from 58 to about 100,000 or more.

Liquid epoxy-containing materials, or mixtures thereof, are always present in the compositions of the invention, although it is permissible, and sometimes desirable, to also include one or more solid epoxy-containing materials in the compositions so long as the final compositions are liquid or fluid in form.

Useful epoxy-containing materials include those which contain cyclohexene oxide groups such as the epoxycyclohexanecarboxylates, typified by 3,4-epoxycyclohexylmethyl-3,4-epoxy-cyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. For a more detailed list of useful epoxides of this nature, reference is made to the U.S. Pat. No. 3,117,099, incorporated herein by reference.

Further epoxy-containing materials which are useful in the practice of this invention include glycidyl ethers of the formula

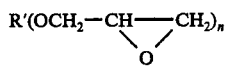

where R' is alkyl or aryl (e.g. phenyl, substituted phenyl) and n is an integer of 1 to 6. Examples are the glycidyl ethers of polyhydric phenols obtained by reacting a polyhydric phenol with an excess of chlorohydrin such as epichlorohydrin (e.g. the diglycidyl ether of 2,2-bis-(2,3-epoxypropoxyphenol)propane). Further examples of epoxides of this type which can be used in the practice of this invention are described in U.S. Pat. No. 3,018,262, incorporated herein by reference, and in "Handbook of Epoxy Resins" by Lee and Neville, McGraw-Hill Book Co., New York (1967).

There are a host of commercially available epoxy-containing materials which can be used in this invention. In particular, epoxides which are readily available include octadecylene oxide, epichlorohydrin, styrene oxide, vinyl cyclohexene oxide, glycidol, glycidylmethacrylate, glycidyl ether of p-tertiarybutylphenol (e.g. those available under the trade designation "Epi-Rez" 5014 from Celanese); diglycidyl ether of Bisphenol A (e.g. those available under the trade designations "Epon 828," "Epon 1004" and "Epon 1010" from Shell Chemical Co., "DER-331," "DER-332," and "DER-334," from Dow Chemical Co.), vinylcyclohexene dioxide (e.g. "ERL-4206" from Union Carbide Corp.), 3,4-epoxycyclohexylmethyl-3,4-epoxycyclohexene carboxylate (e.g. "ERL-4221" from Union Carbide Corp.), 3,4-epoxy-6-methylcyclohexylmethyl-3,4-epoxy-6-methylcyclohexene carboxylate (e.g. "ERL-4201" from Union Carbide Corp.), bis(3,4-epoxy-6-methylcyclohexylmethyl) adipate (e.g. "ERL-4289" from Union Carbide Corp.), bis(2,3-epoxycyclopentyl) ether (e.g. "ERL-0400" from Union Carbide Corp.), aliphatic epoxy modified with polypropylene glycol (e.g. "ERL-4050" and "ERL-4052" from Union Carbide Corp.), dipentene dioxide (e.g. "ERL-4269" from Union Carbide Corp.), epoxidized polybutadiene (e.g. "Oxiron 2001" from FMC Corp.), silicone resin containing epoxy functionality, flame retardant epoxy resins (e.g. "DER-580," a brominated bisphenol type epoxy resin available from Dow Chemical Co.), 1,4-butanediol diglycidyl ether of phenolformaldehyde novolak (e.g. "DEN-431" and "DEN-438" from Dow Chemical Co.), and resorcinol diglycidyl ether (e.g. "Kopoxite" from Koppers Company, Inc.).

Still other epoxy-containing materials are copolymers of acrylic acid esters of glycidol such as glycidylacrylate and glycidylmethacrylate with one or more copolymerizable vinyl compounds. Examples of such copolymers are 1:1 styrene-glycidylmethacrylate, 1:1 methylmethacrylate-glycidylacrylate and a 62.5:24:13.5 methylmethacrylate-ethyl acrylate-glycidylmethacrylate.

Other useful epoxy-containing materials are well known and include such epoxides as epichlorohydrins, e.g. epichlorohydrin; alkylene oxides, e.g. propylene oxide, styrene oxide; alkenyl oxides, e.g. butadiene oxide; glycidyl esters, e.g. ethyl glycidate.

The organic polymer which is included in the compositions of the invention is compatible with the epoxy-containing material (when present in amounts from about 3% to about 50% by weight based on the weight of epoxy-containing material). When the organic polymer is present in an amount greater than about 50%, the composition becomes too viscous to be silk screenable.

The organic polymer is preferably derived from at least one acrylate or methacrylate monomer (i.e. the polymer may be a homopolymer or a copolymer), although copolymers of styrene and allyl alcohol have also been found to be useful as have polyvinyl butyral polymers. It has been found that the organic polymer must have a glass transition temperature in the range of about −20° C. to 105° C. (preferably 50° C. to 60° C.)

The term "polymer" as used herein in meant to include oligomers (e.g. materials having a number average molecular weight as low as about 1000) as well as high polymers (which may have a number average molecular weight ranging up to about 1,000,000). Preferably the number average molecular weight of the organic polymer is in the range of about 15,000 to 60,000.

Although it has been found that the organic polymer may have one or more hydroxyl groups thereon, the organic polymer is otherwise free of "active hydrogens." The term "active hydrogen" is well known and commonly used in the art, and as used herein it means active hydrogen as determined by the method described by Zerewitinoff in J. Am. Chem. Soc., Vol. 49, 3181 (1927), incorporated herein by reference. Of course, the organic polymer is also substantially free of groups which may be thermally or photolytically unstable; that is, the material will not decompose or liberate volatile components at temperatures below about 100° C. or in the presence of actinic light or electron beam irradiation which may be encountered during the desired hardening conditions for the photohardenable composition. Although the organic polymer may also have a minor amount of pendent carboxylic acid groups thereon, the presence of such groups is not preferred because they tend to detract from the desired latency of the compositions.

Thus, the organic polymer may be hydroxy-functional, or it may be essentially non-functional (i.e. containing essentially no groups reactive with the epoxide), or it may be a mixture of both types. When the organic polymer contains hydroxyl functionality the hydroxyl group (or groups) may be terminally situated, or they may be pendent from a polymer or copolymer. The equivalent weight (i.e. the number average equivalent weight) of useful hydroxy-functional organic polymers is at least about 200 and preferably is in the range of about 600 to 1500.

Preferred organic polymers may be derived from various monomers so long as at least one of those monomers is an acrylate or methacrylate monomer, and so long as the resulting polymer has a glass transition temperature in the range of −20° C. to 105° C. For example, representative useful acrylate and methacrylate monomers include:

methylmethacrylate
n-butylacrylate
hydroxyethylacrylate
hydroxyethylmethacrylate
n-butylmethacrylate
hydroxypropylacrylate
hydroxypropylmethacrylate
ethylacrylate Preferably, the acrylate and methacrylate monomers are esters of acrylic, or methacrylic, acid with an aliphatic alcohol of 1 to 4 carbon atoms or an aliphatic diol of 2 to 4 carbon atoms.

Representative non-acrylate monomers which may be reacted with acrylate or methacrylate monomers to produce useful organic polymers include styrene, vinyl acetate, vinyl halides.

Representative useful organic polymers derived from the foregoing monomers include:

methylmethacrylate/styrene/n-butylacrylate/hydroxyethylacrylate
methylmethacrylate/n-butylmethacrylate/hydroxyethylmethacrylate
methylmethacrylate/n-butylmethacrylate Generally speaking, the backbone of the organic polymer contains a major amount (by weight) of acrylate or methacrylate constituents while non-acrylate constituents, if any, represent a minor portion of the backbone. However, it has been found that copolymers derived from styrene and hydroxyethylacrylate (or hydroxyethylmethacrylate) are quite useful even though styrene may constitute as much as about 80% of the backbone.

Useful commercially available organic polymers derived from acrylate or methacrylate monomers include "Elvacite" 2013 (available from E. I. duPont) which is methylmethacrylate(73)/n-butylmethacrylate(27) copolymer; "B-48N" (available from Rohm and Haas) which is an acrylic polymer; "Ionac X-208" (available from Ionac Chemical Company) which is a methylmethacrylate(44)/n-butylmethacrylate(45)/hydroxyethylacrylate(11) copolymer; "QR-572" (available from Rohm and Haas) which is a n-butylacrylate(80)/hydroxyethylacrylate(15)/vinyl acetate(5) copolymer; "G-Cure 868" (available from General Mills) which is a methylmethacrylate(30)/n-butylacrylate(50)/hydroxyethylacrylate(20) copolymer.

It has also been found that very useful organic polymers, which do not contain acrylate or methacrylate constituents in their backbone, are copolymers of styrene and allyl alcohol having a glass transition temperature in the range of −20° C. to 105° C. These copolymers are well known and are commercially available from Monsanto under the designations "RJ-100" and "RJ-101." These copolymers have hydroxyl equivalent weights, respectively, of 300 ± 15 and 220 ± 10, number average molecular weights, respectively, of 1600 and 1150, and glass transition temperatures, respectively, of 105° C. and 100° C.

It has also been found that useful organic polymers include polyvinyl butyral polymers of the type available from Monsanto in its "Butvar" series. For example, "Butvar B-76" is a polyvinyl butyral polymer having an hydroxyl content (expressed as % polyvinylalcohol) of 9–13%, an acetate content (expressed as % polyvinylacetate) of 0–2.5%, and butyral content (expressed as % polyvinylbutyral) of 88%. The glass transition temperature of such polymer is in the range of 48°–55° C.

The amount of organic polymer used in the compositions of the invention may vary over broad ranges, depending upon factors such as the compatibility of the organic polymer with the epoxide, the equivalent weight and functionality of the organic polymer, the physical properties desired in the final hardened resist, etc. It has been found that desirable results are obtained where the organic polymer is present in amounts ranging from about 3% to about 50% by weight based on the weight of epoxy-containing material. When using amounts greater than this the compositions become too viscous to be easily silk screened onto the desired substrate.

The aromatic complex salt photoinitiators useful in the compositions of the invention are known in the art and are generally selected from onium salts of a Group VA element, onium salts of a Group VI A element, and aromatic halonium salts. These complex salts, upon being exposed to ultraviolet radiation or electron beam irradiation, are capable of generating moieties which initiate epoxide reactions.

Preferred photoinitiators include aromatic iodonium complex salts and aromatic sulfonium complex salts.

The photoinitiators which are useful in the compositions of the invention are of two types, viz. aromatic iodonium complex salts and aromatic sulfonium complex salts. The aromatic iodonium complex salts are of the formula:

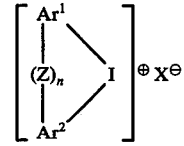

where $Ar^1$ and $Ar^2$ are aromatic groups having 4 to 20 carbon atoms and are selected from the group consisting of phenyl, thienyl, furanyl, and pyrazolyl groups; Z is selected from the group consisting of oxygen; sulfur;

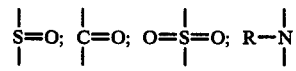

where R is aryl (of 6 to 20 carbons, such as phenyl) or acyl (of 2 to 20 carbons, such as acetyl, benzoyl, etc.); a carbon-to-carbon bond; or

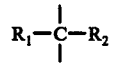

where $R_1$ and $R_2$ are selected from hydrogen, alkyl radicals of 1 to 4 carbons, and alkenyl radicals of 2 to 4 carbons; and $n$ is zero or 1; and wherein $X^-$ is a halogen-containing complex anion selected, for example, from tetrafluoroborate, hexafluorophosphate, hexafluoroarsenate, and hexafluoroantimonate.

The aromatic iodonium cations are stable and are well known and recognized in the art. See for example, U.S. Pat. Nos. 3,565,906; 3,712,920; 3,759,989; and 3,763,187; F. Beringer, et al., Diaryliodonium Salts IX, J. Am. Chem. Soc. 81, 342–51 (1959) and F. Beringer, et al., Diaryliodonium Salts XXIII, J. Chem. Soc. 1964, 442–51; F. Beringer, et al., Iodonium Salts Containing Heterocyclic Iodine, J. Org. Chem. 30, 1141–8 (1965).

Representative $Ar^1$ and $Ar^2$ groups are aromatic groups having 4 to 20 carbon atoms selected from phenyl, thienyl, furanyl, and pyrazolyl groups. These aromatic groups may optionally have one or more fused benzo rings (e.g. naphthyl and the like; benzothienyl, dibenzothienyl; benzofuranyl, dibenzofuranyl; etc.). Such aromatic groups may also be substituted, if desired, by one or more of the following non-basic groups which are essentially non-reactive with epoxide and hydroxy: halogen, nitro, N-arylanilino groups, ester groups (e.g. alkoxycarbonyl such as methoxycarbonyl and ethoxycarbonyl, phenoxycarbonyl), sulfo ester groups (e.g. alkoxysulfonyl such as methoxysulfonyl and butoxysulfonyl, phenoxysulfonyl, and the like), amido groups (e.g. acetamido, butyramido, ethylsulfonamido, and the like), carbamyl groups (e.g. carbamyl, N-alkylcarbamyl, N-phenylcarbamyl, and the like), sulfamyl groups (e.g. sulfamyl, N-alkylsulfamyl, N,N-dialkylsulfamyl, N-phenylsulfamyl, and the like), alkoxy groups (e.g. methoxy, ethoxy, butoxy, and the like), aryl groups (e.g. phenyl), alkyl groups (e.g. methyl, ethyl, butyl, and the like), aryloxy groups (e.g. phenoxy), alkylsulfonyl (e.g. methylsulfonyl, ethylsulfonyl, and the like), arylsulfonyl groups (e.g. phenylsulfonyl groups), perfluoroalkyl groups (e.g. trifluoromethyl, perfluoroethyl, and the like), and perfluoroalkylsulfonyl groups (e.g. trifluoromethylsulfonyl, perfluorobutylsulfonyl, and the like).

Suitable examples of the aromatic iodonium complex salt photoinitiators include:

diphenyliodonium tetrafluoroborate
di(4-methylphenyl)iodonium tetrafluoroborate
phenyl-4-methylphenyliodonium tetrafluoroborate
di(4-heptylphenyl)iodonium tetrafluoroborate
di(3-nitrophenyl)iodonium hexafluorophosphate
di(4-chlorophenyl)iodonium hexafluorophosphate
di(naphthyl)iodonium tetrafluoroborate
di(4-trifluoromethylphenyl)iodonium tetrafluoroborate
diphenyliodonium hexafluorophosphate
di(4-methylphenyl)iodonium hexafluorophosphate
diphenyliodonium hexafluoroarsenate
di(4-phenoxyphenyl)iodonium tetrafluoroborate
phenyl-2-thienyliodonium hexafluorophosphate
3,5-dimethylpyrazolyl-4-phenyliodonium hexafluorophosphate
diphenyliodonium hexafluoroantimonate
2,2'-diphenyliodonium tetrafluoroborate
di(2,4-dichlorophenyl)iodonium hexafluorophosphate
di(4-bromophenyl)iodonium hexafluorophosphate
di(4-methoxyphenyl)iodonium hexafluorophosphate
di(3-carboxyphenyl)iodonium hexafluorophosphate
di(3-methoxycarbonylphenyl)iodonium hexafluorophosphate
di(3-methoxysulfonylphenyl)iodonium hexafluorophosphate
di(4-acetamidophenyl)iodonium hexafluorophosphate
di(2-benzothienyl)iodonium hexafluorophosphate Of the aromatic iodonium complex salts which are suitable for use in the compositions of the invention the preferred salts are the diaryliodonium hexafluorophosphate and the diaryliodonium hexafluoroantimonate. These salts are preferred because, in general, they are more thermally stable, promote faster reaction, and are more soluable in inert organic solvents than are other aromatic iodonium salts of complex ions.

The aromatic iodonium complex salts may be prepared by metathesis of corresponding aromatic iodonium simple salts (such as, for example, the diphenyliodonium bisulfate) in accordance with the teachings of Beringer, et al., J. Am. Chem. Soc. 81, 342 (1959). Thus, for examples, the complex salt diphenyliodonium tetrafluoroborate is prepared gy the addition at 60° C. of an aqueous solution containing 29.2 g. (150 millimoles) silver fluoroborate, 2 g. fluoroboric acid, and 0.5 g. phosphorous acid in about 30 ml. of water to a solution of 44 g. (139 millimoles) of diphenyliodonium chloride. The silver halide that precipitates is filtered off and the filtrate concentrated to yield diphenyliodonium fluoroborate which may be purified by recrystallization.

The aromatic iodonium simple salts may be prepared in accordance with Beringer, et al., above, by various methods including (1) coupling of two aromatic compounds with iodyl sulfate in sulfuric acid, (2) coupling of two aromatic compounds with an iodate in acetic acid-acetic anhydride-sulfuric acid, (3) coupling of two aromatic compounds with an iodine acylate in the presence of an acid, and (4) condensation of an iodoso compound, an iodoso diacetate, or an iodoxy compound with another aromatic compound in the presence of an acid. Diphenyliodonium bisulfate is prepared by method (3), for example, by the addition over a period of eight hours at below 5° C. of a mixture of 35 ml. of conc. sulfuric acid and 50 ml. of acetic anhydride to a well-stirred mixture of 55.5 ml. of benzene, 50 ml. of acetic anhydride, and 53.5 g. of potassium iodate. The mixture is stirred for an additional 4 hours at 0°–5° C. and at room temperature for 48 hours and treated with 300 ml. of diethyl ether. On concentration, crude diphenyliodonium bisulfate precipitates. If desired, it may be purified by recrystallization.

The aromatic sulfonium complex salt photoinitiators suitable for use in the compositions of the invention can be defined by the formula

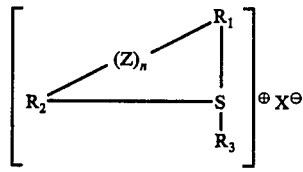

wherein $R_1$, $R_2$, and $R_3$ can be the same or different, provided that at least one of such groups is aromatic, and such groups can be selected from aromatic groups having 4 to 20 carbon atoms (e.g. substituted and unsubstituted phenyl, thienyl, and furanyl) and alkyl radicals having 1 to 20 carbon atoms. The term "alkyl" as used here is meant to include substituted alkyl radicals (for example, substituents such as halogen, hydroxy, alkoxy, aryl). Preferably, $R_1$, $R_2$ and $R_3$ are each aromatic. Z is selected from the group consisting of oxygen; sulfur;

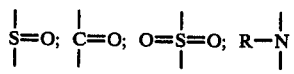

where R is aryl (of 6 to 20 carbons, such as phenyl) or acyl (of 2 to 20 carbons, such as acetyl, benzoyl, etc.); a carbon-to-carbon bond; or

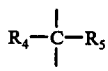

where $R_4$ and $R_5$ are selected from the group consisting of hydrogen, an alkyl radical having 1 to 4 carbon atoms, and an alkenyl radical having 2 to 4 carbon atoms; and $n$ is 0 or 1; and $X^-$ is a halogen-containing complex anion selected, for example, from the group consisting of tetrafluoroborate, hexafluorophosphate, hexafluoroarsenate, and hexafluoroantimonate.

Aromatic sulfonium salts are known and recognized in the art. Triaryl-substituted sulfonium compounds, for example, can be prepared by the procedure described in G. H. Wiegand, et c., Synthesis and Reactions of Triarylsulfonium Halides, J. Org. Chem. 33, 2671–75 (1968). Aromatic sulfonium salts also having alkyl-substitution can be prepared by the procedures described in K. Ohkubo et al., J. Org. Chem. 36, 3149–55 (1971). The preferred method for making triaryl-substituted sulfonium compounds is described in U.S. Pat. No. 2,807,648, incorporated herein by reference, from which the complex sulfonium salts can be made. The complex sulfonium salts can be prepared from the corresponding simple salts, such as the halide salts, by metathesis with a metal or ammonium salt of the complex anion desired.

The sulfonium complex salts are substituted with at least one, and preferably three, aromatic groups. Representative groups are aromatic groups having 4 to 20 carbon atoms and are selected from phenyl, thienyl and furanyl groups. These aromatic groups may optionally have one or more fused benzo rings (e.g. naphthyl and the like; benzothienyl, dibenzothienyl; benzofuranyl, dibenzofuranyl; etc.). Such aromatic groups may also be substituted, if desired, by one or more of the following non-basic groups which are essentially non-reactive with epoxide and hydroxy: halogen, nitro, aryl, ester groups (e.g. alkoxycarbonyl such as methoxycarbonyl and ethoxycarbonyl, phenoxycarbonyl and acyloxy such as acetoxy and propionyloxy), sulfo ester groups (e.g. alkoxysulfonyl such as methoxysulfonyl and butoxysulfonyl, phenoxysulfonyl, and the like), amido groups (e.g. acetamido, butyramido, ethylsulfonamido, and the like), carbamyl groups (e.g. carbamyl, N-alkylcarbamyl, N-phenylcarbamyl, and the like), sulfamyl groups (e.g. sulfamyl, N-alkylsulfamyl, N,N-dialkylsulfamyl, N-phenylsulfamyl, and the like), alkoxy groups (e.g. methoxy, ethoxy, butoxy, and the like), aryl groups (e.g. phenyl), alkyl groups (e.g. methyl, ethyl, butyl, and the like) aryloxy groups (e.g. phenoxy), alkylsulfonyl (e.g. methylsulfonyl, ethylsulfonyl, and the like), arylsulfonyl groups (e.g. phenylsulfonyl groups), perfluoroalkyl groups (e.g. trifluoromethyl, perfluoroethyl, and the like), and perfluoroalkylsulfonyl groups (e.g. trifluoromethylsulfonyl, perfluorobutylsulfonyl, and the like).

Examples of suitable aromatic sulfonium complex salt photoinitiators include:

triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluoroantimonate
tris(4-phenoxyphenyl)sulfonium hexafluorophosphate
di(4-ethoxyphenyl)methylsulfonium hexafluoroarsenate
4-acetoxy-phenyldiphenylsulfonium tetrafluoroborate
tris(4-thiomethoxyphenyl)sulfonium hexafluorophosphate
di(methoxysulfonylphenyl)methylsulfonium hexafluoroantimonate
di(methoxynaphthyl)methylsulfonium tetrafluoroborate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
methyl(n-methylphenothiazinyl)sulfonium hexafluoroantimonate
phenylmethylbenzylsulfonium hexafluorophosphate

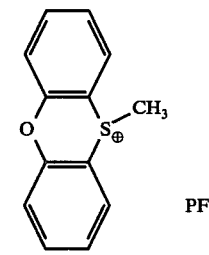

(10-methylphenoxathiinium hexafluorophosphate)

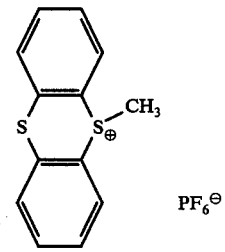

(5-methylthianthrenium hexafluorophosphate)

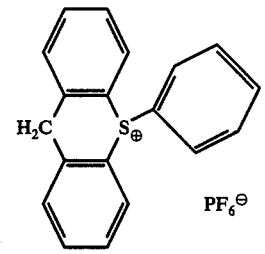

(10-phenylthioxanthenium hexafluorophosphate)

-continued

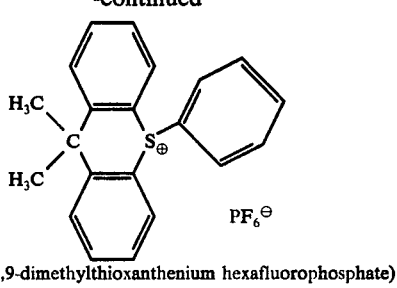

(10-phenyl-9,9-dimethylthioxanthenium hexafluorophosphate)

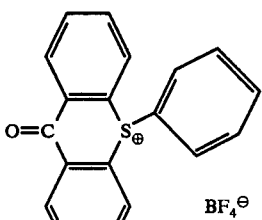

(10-phenyl-9-oxothioxanthenium tetrafluoroborate)

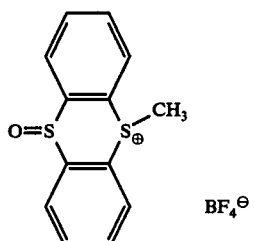

(5-methyl-10-oxothianthrenium tetrafluoroborate)

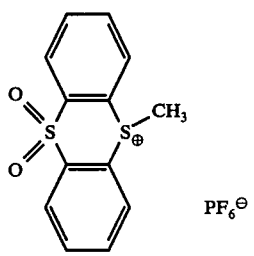

(5-methyl-10,10-dioxothianthrenium hexafluorophosphate)

Of the aromatic sulfonium complex salts which are suitable for use in the compositions of the invention the preferred salts are the triaryl-substituted salts such as triphenylsulfonium hexafluorophosphate. The triaryl-substituted salts are preferred because they are more thermally stable than the mono- and diaryl substituted salts thereby providing a one-part system with long shelf life. The triaryl-substituted complex salts are also more amenable to dye sensitization. Consequently, the use of such complex salts results in compositions which are much more useful in applications where near ultraviolet and visible light are used for exposure.

Aromatic complex salt photoinitiators are also described in Belgium Patents 828,668; 828,669; 828,670; as well as in other publications available to the art.

The compositions of the invention may also contain various additives such as conventional fillers (e.g. barium sulfate, talc, glass bubbles) viscosity modifiers (e.g. pyrogenic silica), pigments, etc.

The photohardening of the compositions of the invention occurs on exposure of the compositions to any source of radiation emitting actinic radiation at a wavelength within the ultraviolet and visible spectral regions. Suitable sources of radiation include mercury, xenon, carbon arc and tungsten filament lamps, sunlight, etc. Exposures may be from less than about 1 second to 10 minutes or more depending upon the amounts of particular epoxy materials and organic polymers and aromatic complex salts being utilized and depending upon the radiation source and distance from the source and the thickness of the resist pattern to be hardened. The compositions may also be hardened by exposure to electron beam irradiation. One of the major advantages of electron beam exposure is that highly pigmented compositions can be effectively hardened at a faster rate than by exposure to actinic radiation.

The hardening is a triggered reaction, i.e. once the degradation of the aromatic complex salt has been initiated by exposure to a radiation source, the hardening reaction proceeds and will continue after the radiation source is removed. The use of thermal energy during or after exposure to a radiation source will generally accelerate the hardening reaction, and even a moderate increase in temperature may greatly accelerate hardening rate.

The amount of aromatic complex salt photoinitiator that may be employed in the compositions of the invention is from about 0.5 to 10 parts by weight per 100 parts by weight of organic material (i.e. epoxide plus organic polymer) and preferably from about 1 to 5 parts per 100 parts of organic material. If desired, the composition may be prepared in shelf stable concentrate form (i.e. with high levels of complex salt) which is suitable for later dilution to a more commercially practical coating composition (e.g. by adding more epoxide or organic polymer, or both, at the location where used).

Generally speaking the rate of hardening increases with increasing amounts of complex salt at a given light exposure or irradiation. The rate of hardening also increases with increasing light intensity or electron dosage. For those compositions wherein a sensitizer is used to make the composition sensitive to radiation of longer wavelength, about 0.01 to 1.0 part and preferably about 0.1 to 1.0 part by weight of sensitizer per part of aromatic complex salt may be employed.

The compositions of the invention are prepared by simply admixing, under "safe light" conditions, the aromatic complex salt and the sensitizer, when used, with the organic material. Solventless compositions are prepared by dissolving the aromatic complex salt and sensitizer in the organic material with or without the use of mild heating.

The aromatic iodonium complex salts useful in the compositions of the invention are of themselves photosensitive only in the ultraviolet. They, however, can be sensitized to the near ultraviolet and the visible range of the spectrum by sensitizers for known photolyzable organic halogen compounds in accordance with the teachings of U.S. Pat. No. 3,729,313 which is incorporated herein by reference. Illustrative sensitizers are found in the following categories: aromatic amines, and colored aromatic polycyclic hydrocarbons. The use of strongly basic amino compounds is less desirable.

The aromatic sulfonium complex salts useful in the compositions of the invention are of themselves photosensitive only in the ultraviolet. They, however, are sensitized to the near ultraviolet and the visible range of the spectrum by a select group of sensitizers. Useful sensitizers are found in the following categories: aromatic tertiary amines, aromatic tertiary diamines, and aromatic polycyclic compounds having at least three fused benzene rings and having an ionization energy less than about 7.5 ev., as calculated by the method of F. A. Matsen, *J. Chem. Physics*, 24, 602 (1956), incorporated herein by reference. Representative sensitizers coming within the above useful classes include, e.g. triphenylamine, 2-ethyl-9,10-dimethoxyanthracene, anthracene, 9-methylanthracene, rubrene, perylene, and tetraphenylbenzidine.

In the following examples which will serve to illustrate the present invention, all parts are parts by weight and all percentages are given as percentages by weight, unless otherwise indicated.

EXAMPLE 1

A suitable photohardenable, liquid composition is prepared using the following ingredients:

|  | Parts |
|---|---|
| "Epi-Rez" 5014 (monofunctional, liquid epoxide) | 20 |
| "QR-608" (hydroxy-functional acrylate polymer, 60% solids in solvent; polymer hydroxyl equiv. wt. 600) | 8.2 |
| Diphenyliodonium hexafluorophosphate | 1 |
| "Aerosil R-972" (pyrogenic silica, available from Degussa) | 3 |
| Scarlet Red Pigment | 1.2 |

The epoxide and the acrylate polymer (in solvent) are blended together, after which the solution is heated to about 60°–80° C. and the solvent is removed under vacuum. To the cooled solution of epoxide and acrylate polymer is added the complex salt photoinitiator. Mild heating and stirring of the solution are used in order to solvate the photoinitiator. The silica and the pigment are dispersed in the epoxide solution (containing organic polymer and photoinitiator) by means of a conventional paint mill.

The resulting 100% solids, photohardenable composition has a viscosity such that it may be applied to the copper surface of a copper-dielectric laminate by means of the conventional silk screen method to produce a resist pattern of approximately 25–40 microns thick on the copper surface. The resist pattern is then hardened by exposure to a 200 watt per inch medium pressure mercury vapor lamp in an "Ashdee" UV Processor (approximately 4–6 inches from lamp for a time of approximately 3–5 seconds).

The copper-dielectric laminate, with hardened resist pattern on portions of the copper surface, is placed on a conveyor belt and passed through a warm (i.e. 50° C.) spray of an alkaline etchant ("Continue Etch," available from McDermid) for approximately one minute. The resulting etched laminate is then rinsed with water and dried. The hardened resist pattern is then removed by placing the laminate on a conveyor belt which is passed through a methylene chloride spray. The end product obtained is a fine copper pattern on the dielectric.

EXAMPLE 2

A suitable photohardenable, liquid composition is prepared using the following ingredients:

|  | Parts |
|---|---|
| "Epi-Rez" 5014 | 20 |
| "X-208" (hydroxy-functional acrylate polymer; hydroxyl equiv. wt. 1305; glass transition temperature 59° C.) | 5 |
| Diphenyliodonium hexafluorophosphate | 1 |
| "Aerosil R-972" | 3 |
| Scarlet Red Pigment | 1.2 |

The acrylate polymer is added to the epoxide, with stirring, and the mixture is heated to approximately 120°–150° C. until a solution is obtained. The remaining ingredients are added in accordance with the procedure of Example 1.

The resulting photohardenable composition is applied to a copper surface, exposed, and processed in accordance with the procedures of Example 1. A fine copper pattern on the dielectric is obtained.

EXAMPLE 3

A suitable photohardenable, liquid composition is prepared using the following ingredients:

|  | Parts |
|---|---|
| "Epi-Rez" 5014 | 20 |
| "ERL-4221" (a difunctional liquid epoxide) | 2.5 |
| "X-208" (hydroxy-functional acrylate polymer) | 5 |
| Diphenyliodonium hexafluorophosphate | 1 |
| "Cab-O-Sil M-5"(pyrogenic silica; available from Cabot Corporation) | 3 |
| Scarlet Red Pigment | 1.2 |

The ingredients are blended together in accordance with the procedures of Example 2. The resulting composition is applied to a copper surface, exposed, and processed in accordance with the procedures of Example 1. A fine copper pattern on the dielectric is obtained.

EXAMPLE 4

A suitable photohardenable, liquid composition is prepared using the following ingredients:

|  | Parts |
|---|---|
| "Epi-Rez" 5014 | 20 |
| "QR-608" | 8.3 |
| "ERL-4221" | 2.5 |
| Diphenyliodonium hexafluorophosphate | 1 |
| "Aerosil R-972" | 3 |
| Scarlet Red Pigment | 1.2 |

The ingredients are blended together in accordance with the procedures of Example 1. The resulting composition is applied to a copper surface, exposed, and processed in accordance with the procedures of Example 1. A fine copper pattern on the dielectric is obtained.

EXAMPLE 5

A suitable photohardenable, liquid composition is prepared using the following ingredients:

|  | Parts |
|---|---|
| "Epi-Rez" 5014 | 21.3 |
| "ERL-4221" | 2.5 |
| "RJ-101" (a copolymer of styrene and allyl alcohol) | 3.7 |
| Diphenyliodonium hexafluorophosphate | 1 |
| "Aerosil R-972" | 3 |
| Scarlet Red Pigment | 1.2 |

The ingredients are blended together in accordance with the procedures of Example 2. The resulting composition is applied to a copper surface, exposed, and processed in accordance with the procedures of Example 1. A fine copper pattern on the dielectric is obtained.

EXAMPLE 6

A suitable photohardenable, liquid composition is prepared using the following ingredients:

|  | Parts |
| --- | --- |
| "Epi-Rez" 5014 | 20 |
| "Elvacite 2013" (non-functional acrylate polymer) | 5 |
| "ERL-4221" | 2.5 |
| Diphenyliodonium hexafluorophosphate | 1 |
| "Aerosil R-972" | 3 |
| Scarlet Red Pigment | 1.2 |

The ingredients are blended together in accordance with the procedures of Example 2. The resulting composition is applied to a copper surface, exposed, and processed in accordance with the procedures of Example 1. A fine copper pattern on the dielectric is obtained.

EXAMPLE 7

A suitable photohardenable, liquid composition is prepared using the following ingredients:

|  | Parts |
| --- | --- |
| "Epi-Rez" 5014 | 22.5 |
| "Butvar B-76" | 2.5 |
| "ERL-4221" | 2.5 |
| Diphenyliodonium hexafluorophosphate | 1 |
| "Aerosil R-972" | 3 |
| Scarlet Red Pigment | 1.2 |

The ingredients are blended together in accordance with the procedures of Example 2. The resulting composition is applied to a copper surface, exposed, and processed in accordance with the procedures of Example 1. A fine copper pattern on the dielectric is obtained.

The photohardenable compositions of this invention are useful as resists in both plating and etching processes (which may involve either acidic or alkaline environments).

What is claimed is:

1. A photohardenable, liquid composition comprising:
   (a) an organic compound having an average epoxide functionally in the range of about 1 to 1.3;
   (b) an organic polymer which is compatible with said organic compound, said polymer having a glass transition temperature in the range of about −20° C. to 105° C. and being selected from (i) polymers derived from at least one acrylate or methacrylate monomer, (ii) copolymers of styrene and allyl alcohol, and (iii) polyvinyl butyral polymers; said polymer being present in an amount of about 3% to about 50% by weight based on the weight of said organic compound; and
   (c) an effective amount of an aromatic complex salt photoinitiator selected from an onium salt of a Group VA element, and onium salt of a Group VI A element, and an aromatic halonium salt.

2. A photohardenable composition in accordance with claim 1, wherein said organic polymer is selected from copolymers of methylmethacrylate/n-butylmethacrylate, methylmethacrylate/n-butylmethacrylate/hydroxyethylmethacrylate, methylmethacrylate/styrene/n-butylacrylate/hydroxyethylacrylate, styrene/hydroxyethylacrylate, and n-butylacrylate/hydroxyethylacrylate/vinyl acetate.

3. A photohardenable composition in accordance with claim 1, wherein said organic polymer has an hydroxyl equivalent weight in the range of 200 to 1500.

4. A photohardenable composition in accordance with claim 1, wherein said organic compound is selected from glycidyl ethers and epoxy-containing materials which contain cyclohexene oxide groups.

5. A photohardenable composition in accordance with claim 1, wherein said organic polymer has a glass transition temperature in the range of about 50° C. to 60° C.

6. A photohardenable composition in accordance with claim 1, wherein said organic polymer is non-functional and has a molecular weight in the range of about 15,000 to 60,000.

7. A photohardenable composition in accordance with claim 1, wherein said photoinitiator is selected from aromatic iodonium complex salts and aromatic sulfonium complex salts.

8. A photohardenable composition in accordance with claim 7, wherein said photoinitiator is of the formula:

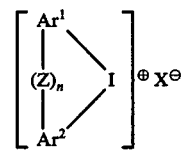

where $Ar^1$ and $Ar^2$ are aromatic groups having 4 to 20 carbon atoms and are selected from the group consisting of phenyl, thienyl, furanyl and pyrazolyl groups; Z is selected from the group consisting of oxygen; sulfur;

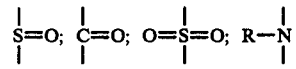

where R is aryl or acyl; a carbon-to-carbon bond; or

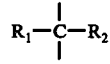

where $R_1$ and $R_2$ are selected from hydrogen, alkyl radicals of 1 to 4 carbons, and alkenyl radicals of 2 to 4 carbons; and $n$ is 0 or 1; and wherein $X^-$ is a halogen-containing complex anion selected from tetrafluoroborate, hexafluorophosphate, hexafluoroarsenate, and hexafluoroantimonate.

9. A photohardenable composition in accordance with claim 7, wherein said photoinitiator is of the formula:

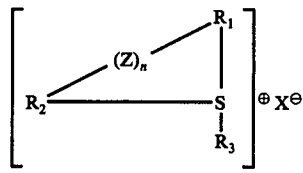

wherein $R_1$, $R_2$ and $R_3$ are selected from the group consisting of aromatic groups having 4 to 20 carbon atoms and alkyl radicals having 1 to 20 carbon atoms; wherein at least one of $R_1$, $R_2$ and $R_3$ is aromatic; wherein Z is selected from the group consisting of oxygen; sulfur;

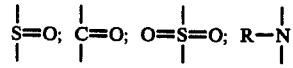

where R is aryl or acyl; a carbon-to-carbon bond; or

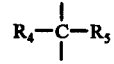

where $R_4$ and $R_5$ are selected from the group consisting of hydrogen, an alkyl radical having 1 to 4 carbon atoms, and an alkenyl radical having 2 to 4 carbon atoms; and $n$ is 0 or 1; and X is a halogen-containing complex anion selected from tetrafluoroborate, hexafluorophosphate, hexafluoroarsenate, and hexafluoroantimonate.

* * * * *